United States Patent
Maeda

[11] Patent Number: 5,841,713
[45] Date of Patent: Nov. 24, 1998

[54] WAFER TEST METHOD CAPABLE OF COMPLETING A WAFER TEST IN A SHORT TIME

[75] Inventor: Tetsunori Maeda, Tokyo, Japan

[73] Assignee: NEC Corporation, Tokyo, Japan

[21] Appl. No.: 111,158

[22] Filed: Jul. 7, 1998

[30] Foreign Application Priority Data

Jul. 7, 1997 [JP] Japan ..................... 9-196437

[51] Int. Cl.⁶ ........................................... G11C 7/00
[52] U.S. Cl. .......................................... 365/201; 365/200
[58] Field of Search ........................ 365/201, 200; 438/17

[56] References Cited

U.S. PATENT DOCUMENTS 5,399,505  3/1995  Dasse et al. ................. 438/17
5,581,510  12/1996  Furusho et al. .............. 365/201

*Primary Examiner*—David Nelms
*Assistant Examiner*—Trong Phan
*Attorney, Agent, or Firm*—Foley, Hoag & Eliot LLP

[57] ABSTRACT

On carrying out a wafer test for a plurality of semiconductor wafers, N in number, each having a plurality of chips, an initial wafer test is carried out for all of the semiconductor wafers to produce an initial wafer test result representing that each chip of each of the semiconductor wafers is any one of a good chip, a defective chip, and a predictive good chip which is predicted as the good chip if subjected to trimming. Subsequently, each of the predictive good chips is subjected to the trimming to be repaired as the good chips. After that, a final wafer test (8001–8012) is carried out for a reduced number M (M being a positive integer less than N) of sampled wafers sampled among the semiconductor wafers to produce a final wafer test result representing that each chip of each of the sampled wafers is any one of the good chip and the defective chip. The initial wafer test result for the semiconductor wafers except the sampled wafers is modified into a modified wafer test result for the semiconductor wafers except the sampled wafers so that each chip represented as the predictive good chip by the initial wafer test result is also represented as the good chip by the modified wafer test result. An entire wafer test result for all of the semiconductor wafers is produced by adding the modified wafer test result to the final wafer test result.

9 Claims, 15 Drawing Sheets

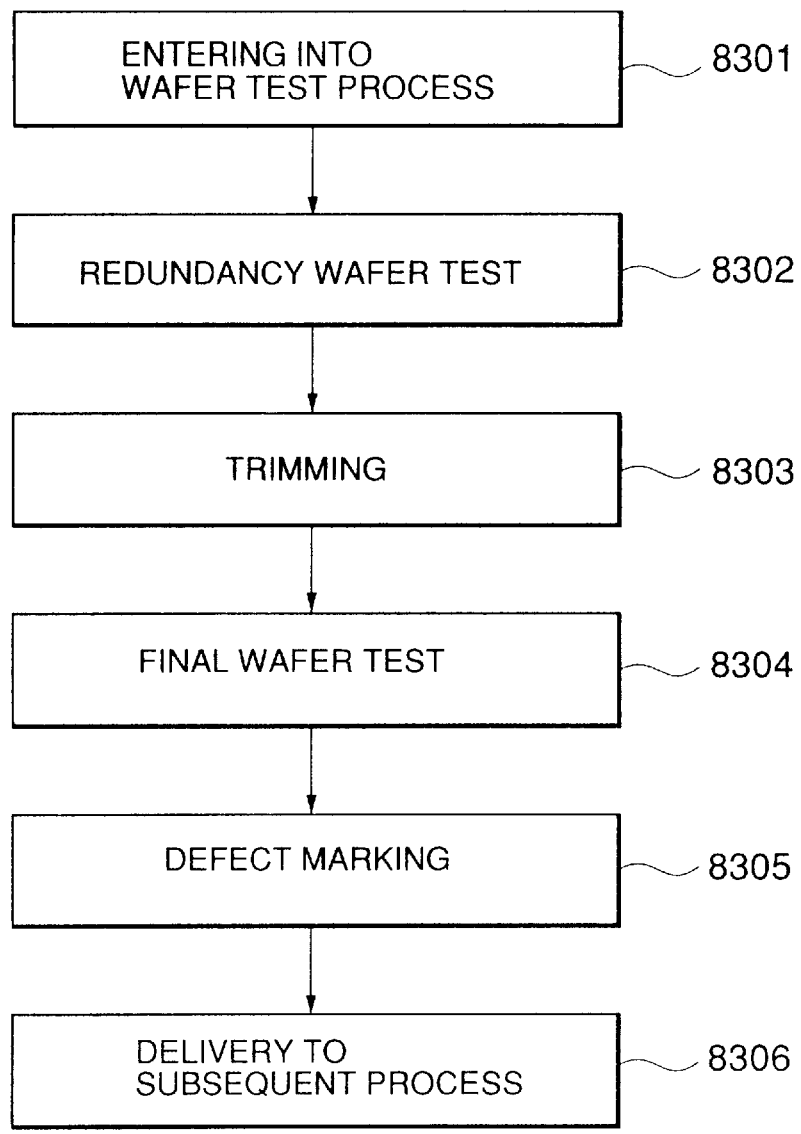

Fig.6

| HEADER INFORMATION |
| --- |
| MAP DATA OF SLOT-1 |
| MAP DATA OF SLOT-2 |
| MAP DATA OF SLOT-3 |
| |
| MAP DATA OF SLOT-24 |
| MAP DATA OF SLOT-25 |

```
                                                          HEADER INFORMATION
NAME MEMORY LOT # LOT-A PROCESS FINAL............
Wafer # 1_ # 9,1,FAIL,1011011011010100 # A,1,PASS,1100010000000000 # B,I,PASS,
1100010000000000 # C,1,FAIL,1011011011010100 # D,1,,FAIL,1011011011010100
 # 6,2,FAIL1011011011010100 # 6,3,PASS,1100010000000000 ----(OMITTED) ....     ⎫
..... # 9,D,FAIL,1011011011010100 # A,D,PASS,1100010000000000 # B,D,PASS,110001 ⎬ c
0000000000 # C,D,FAIL,1011011011010100 # D,D,,FAIL,1011011011010100!!           ⎭
...... (OMITTED)
Wafer # 13_ # 9,1,FAIL,1011011011010100 # A,1,PASS,1100010000000000 # B,I,PASS,
1100010000000000 # C,1,FAIL,1011011011010100 # D,1,,FAIL,1011011011010100
 # 6,2,FAIL1011011011010100 # 6,3,PASS,1100010000000000 .....(OMITTED) ....     ⎫
.... # ,9,D,FAIL,1011011011010100 # A,D,PASS,1100010000000000 # B,D,PASS,       ⎬ d
1100010000000000 # C,D,FAIL,1011011011010100 # D,D,,FAIL,1011011011010100!!     ⎭
....... (OMITTED)
```

Fig.10

| HEADER INFORMATION |
| --- |
| SLOT DATA OF SLOT-1 |
| SLOT DATA OF SLOT-2 |
| SLOT DATA OF SLOT-3 |
|  |
| SLOT DATA OF SLOT-24 |
| SLOT DATA OF SLOT-25 |

Fig.11

HEADER INFORMATION

NAME MEMORY LOT#LOT-A PROCESS FINAL .....................

Wafer # 1_1

Wafer # 2_0

Wafer # 3_1

Wafer # 4_1

Wafer # 5_1

......... (OMITTED)

Wafer # 20_1

Wafer # 21_1

Wafer # 22_1

Wafer # 23_1

Wafer # 24_0

Wafer # 25_1

WAFER TEST METHOD CAPABLE OF COMPLETING A WAFER TEST IN A SHORT TIME

BACKGROUND OF THE INVENTION

This invention relates to a method of carrying out a wafer test for an inspection lot which is a set of semiconductor wafers, each having a plurality of chips, each chip having a memory unit.

As will later be described in detail, a conventional method according to the prior art is incapable of completing a wafer test for a set of semiconductor wafers in a short time.

SUMMARY OF THE INVENTION

It is therefore an object of this invention to provide a method which is capable of completing a wafer test in a short time.

A method to which this invention is applicable is for carrying out a wafer test for semiconductor wafers, equal in number to N (N being an integer greater than one). Each of the semiconductor wafers comprises a plurality of chips. Each chip comprises a memory unit.

According to this invention, the method comprises: an initial wafer test step of carrying out an initial wafer test for all of the semiconductor wafers to judge whether each chip of each of the semiconductor wafers is a good chip or a defective chip and whether or not each chip of each of the semiconductor wafers is a predictive good chip which is predicted as the good chip if subjected to trimming, the initial wafer test step producing an initial wafer test result representing that each chip of each of the semiconductor wafers is any one of the good chip, the defective chip, and the predictive good chip; a trimming step of subjecting each of the predictive good chips to the trimming in response to the initial wafer test result to repair the predictive good chips into the good chips; a final wafer test step of carrying out a final wafer test for a reduced number M (M being a positive integer less than N) of sampled wafers sampled among the semiconductor wafers to judge whether each chip of each of the sampled wafers is the good chip or the defective chip, the final wafer test step produce a final wafer test result representing that each chip of each of the sampled wafers is any one of the good chip and the defective chip; an initial wafer test result modifying step of modifying the initial wafer test result for the semiconductor wafers except the sampled wafers to produce a modified wafer test result for the semiconductor wafers except the sampled wafers so that each chip represented as the predictive good chip by the initial wafer test result is also represented as the good chip by the modified wafer test result; and an entire wafer test result producing step of producing an entire wafer test result for all of the semiconductor wafers by adding the modified wafer test result to the final wafer test result.

BRIEF DESCRIPTION OF THE DRAWING

FIG. 4 is a view showing a flow chart of a wafer test process in the description of this invention and the prior art example;

FIG. 6 is a view showing the structure of the MAP data for describing the one embodiment of this invention;

FIG. 10 is a view showing the structure of SLOT data for describing the one embodiment of this invention;

FIG. 11 is a view showing a detailed content of the SLOT data for describing FIG. 10;

DESCRIPTION OF THE PREFERRED EMBODIMENT

Figure 1:
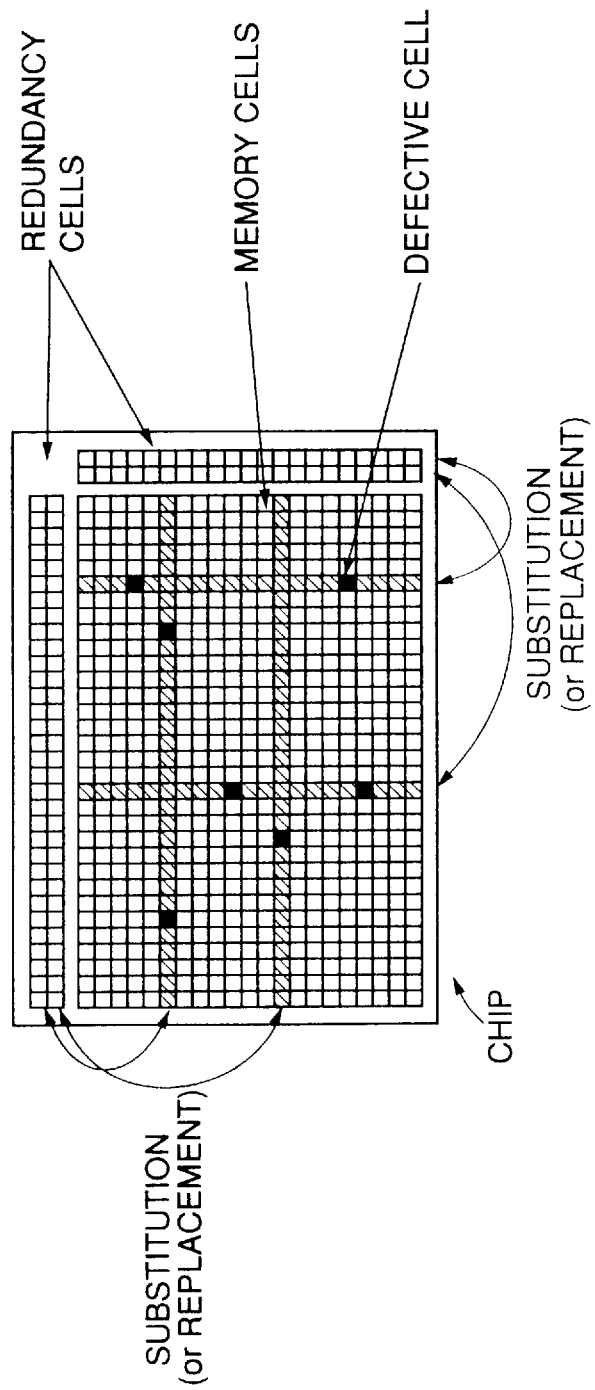
FIG. 1 is a view for use in describing substitution of redundancy cells for defective cells on each chip of a semiconductor wafer.

Referring to FIG. 1, description will be made as regards each of a plurality of chips included in each semiconductor wafer. Each chip has a memory unit having memory cells and redundancy cells which are substitutable for defective cells of the memory cells by trimming known in the art. In the chip being illustrated, substitution of the redundancy cells is possible for all of the defective cells by the trimming. However, if the number of the redundancy cells increases, substitution of the redundancy cells is impossible for all of the defective cells. Such substitution is also called replacement in the art.

Figure 2:
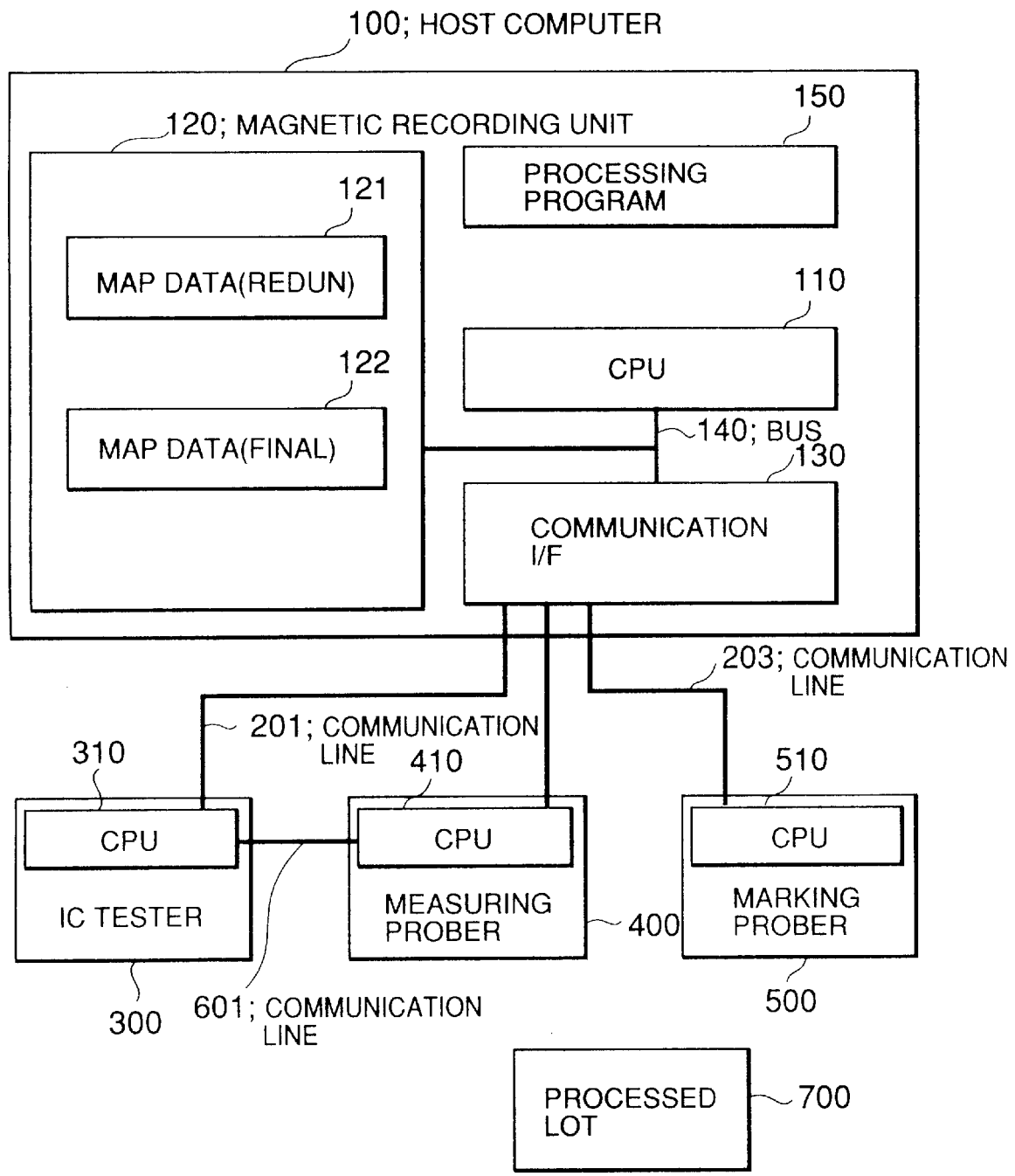
FIG. 2 is a view showing a prior art structure.

In recent years, a working period of a wafer test process of the memory unit is extended following an increase in memory capacity and wafer diameter. FIG. 2 shows an example of a wafer test system which carries out a conventional method.

Referring to FIG. 2, the conventional method will be described for a better understanding of this invention. In FIG. 2, the wafer test system has as a minimum structure a combination of an IC tester 300 and a measuring (or testing) prober 400. At present, development is made of a networking arrangement with a marking (or inking) prober 500 for ink-marking (may simply be referred to as "marking" hereinafter) of defective chips. Thus, it becomes less often to use a single prober for both the measurement and the ink-marking.

Figure 3A:
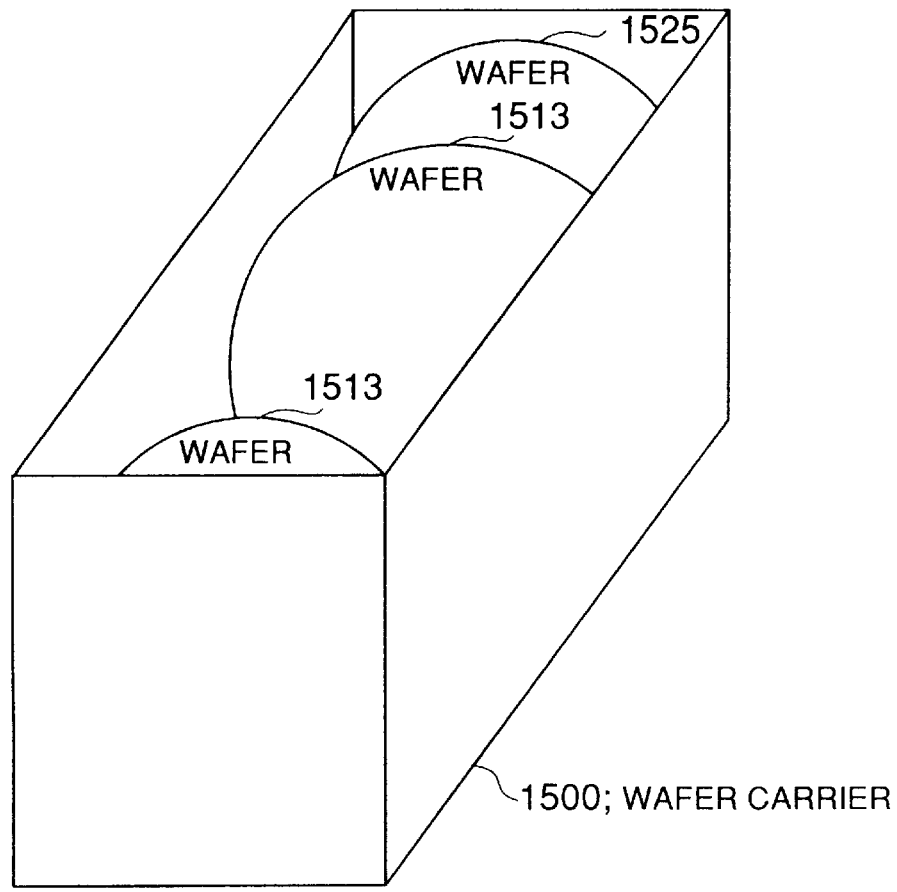
FIGS. 3A and 3B are views showing a wafer package in the wafer test process in the description of this invention and the prior art example.
Figure 3B:
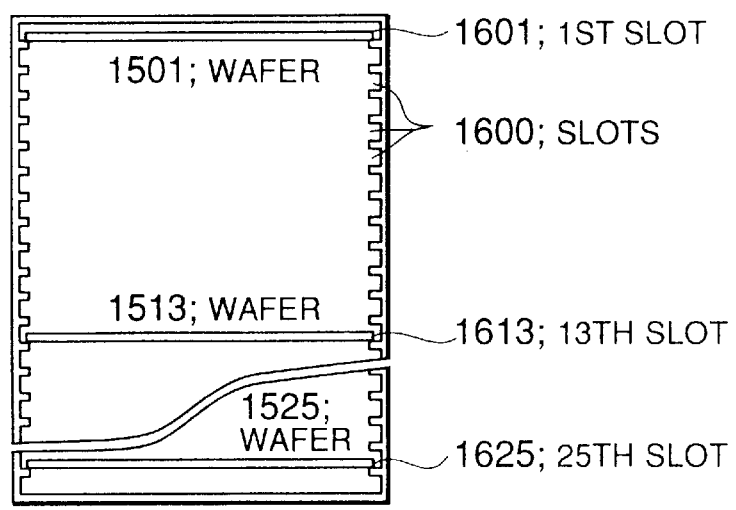

FIG. 3A shows a wafer package in the wafer test process. A wafer carrier 1500 typically contains twenty-five wafers 1501 through 1525. For clarity, only three wafers 1501, 1502, and 1525 are shown in the figure. The wafer carrier 1500 is provided with a plurality of recesses formed in inner side surfaces thereof to separately locate the wafers, as seen from a top view in FIG. 3B. These recesses are called slots 1600.

In the following description, the slots 1600 are successively identified in correspondence to the wafers 1501 through 1525 received therein. Specifically, the first wafer 1501, the thirteenth wafer 1513, and the twenty-fifth wafer 1525 are received in the first slot 1601, the thirteenth slot 1613, and the twenty-fifth slot 1625, respectively.

In particular, the memory is mass-produced. Therefore, it is general that the wafers 1501 through 1525 are received in all of the slots 1600 of one wafer carrier. Hereinafter, such a package is referred to as a processed lot (or an inspection lot) 700 (FIG. 2).

FIG. 4 shows a flow chart of a typical wafer test process. After chips are formed in a diffusion process, the wafers 1501 through 1525 are received in the wafer carrier 1500 (FIG. 3A) to be entered into the wafer test process (step 8301). The processed lot thus entered is subjected to a redundancy wafer test or an initial wafer test (step 8302), a trimming process (step 8303), a final wafer test (step 8304), and a defect marking process (step 8305) to be delivered to a subsequent process (step 8306).

Description will be made about the redundancy (or initial) wafer test (step 8302 in FIG. 4). The redundancy (or initial) wafer test (redundancy/memory repair test) is carried out by the structure composed of the IC tester 300 and the measuring prober 400 in FIG. 2. The IC tester 300 and the measuring prober 400 are connected via a communication line 601 for communication of a test start request from the measuring prober 400 and a good/defective judgment result from the IC tester 300.

The IC tester 300 is loaded with a test program for the redundancy test of the processed lot 700. Likewise, the measuring prober 400 is set with prober conditions for handling the processed lot 700. Loading of the test program and setting of the prober conditions are known from a manual offered by a manufacturer.

Figure 5:
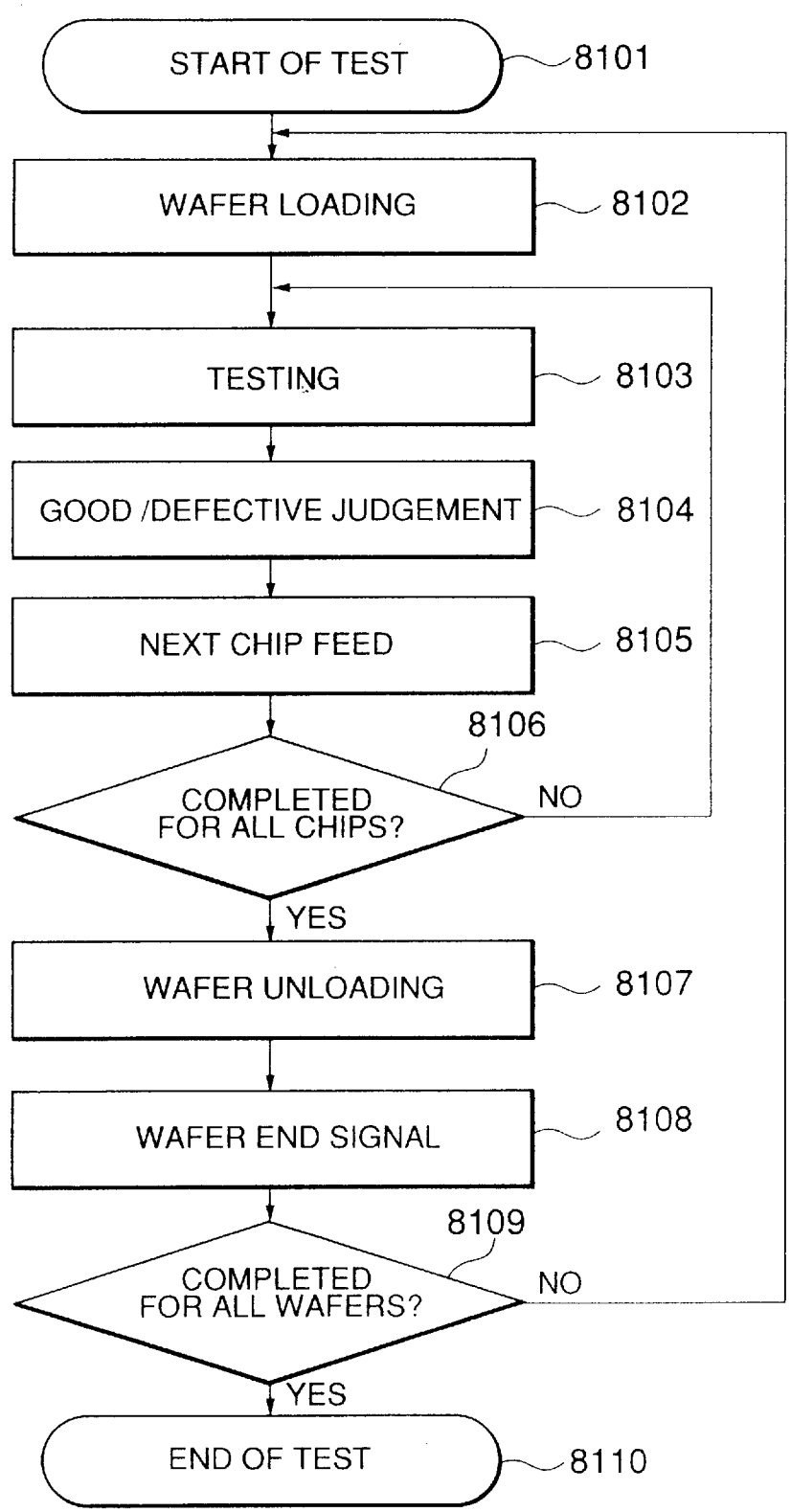
FIG. 5 is a view showing a flow chart of a test in this invention and in a prior art example.

FIG. 5 is a flow chart of the redundancy (or initial) wafer test. Referring to FIGS. 2 and 5, the test is started at the measuring prober 400 (step 8101). At first, the first wafer 1501 in the wafer carrier 1500 (FIG. 3A) as the processed lot 700 is loaded (step 8102). By a wafer alignment (not shown), the position of a first one of the formed chips is detected. A stage with the wafer mounted thereon is raised to bring a pad of the chip into contact with a needle of an electrode unit called a probe card.

In this state, the measuring prober 400 delivers the "test start request" to the IC tester 300 through the communication line 601. Then, the test program loaded in the IC tester 300 starts running to initiate a redundancy characteristic test (step 8103).

If the chip is insufficient and completely good, it is judged "defective" and "good", respectively. If a memory cell is defective but can be used by a redundancy cell, the chip is judged "good" and set with "BIN/predicted good by trimming (step 8303 in FIG. 4)" and the "good/defective judgment result" and the "BIN result" are transmitted from the IC tester 300 to the measuring prober 400 through the communication line 601 (step 8104). It is noted that "BIN" represents discrimination between a good product and a defective product of a measured device or a performance rank with reference to a test result.

Next, the measuring prober 400 lowers the stage to release the contact between the probe card and the chip. After moving to a next chip, the stage is raised to bring the probe card and the next chip into contact (step 8105).

Judgment is then made about whether or not the test has been completed for all chips formed on the wafer 1501 (step 8106). If the test has not yet been completed for all chips, the operation returns to the step 8102 to continue the test. If the test has been completed for all chips, the wafer 1501 is returned to the wafer carrier 1500 (referred to as "wafer unloading") (step 8107) and a wafer end signal is transmitted from the measuring prober 400 to the IC tester 300 through the communication line 601 (step 8108).

The measuring prober 400 also supplies a host computer 100 through a communication line 202 with the wafer end signal together with the "good/defective judgment result" and the "BIN result" obtained in the above-mentioned test for each formed chip.

Typical communication is carried out by a CPU 410 of the measuring prober 400 in accordance with the protocol prescribed in SECS (SEMI Equipment Communication Standard). In the host computer 100, the transmitted results are received by a communication interface (I/F) 130 and processed by a CPU 110 to be recorded in a magnetic recording unit 120 as MAP data 121 of the redundancy test ("Redun" in FIG. 2). In the host computer 100, a processing program 150 is already started to perform receiving operation from the measuring prober 400 in accordance with SECS and recording operation in the magnetic recording unit 120 in a MAP data structure illustrated in FIG. 6. FIG. 6 shows the MAP data structure which includes header information followed by the MAP data having slots 1 through 25.

On the other hand, the IC tester 300 carries out following operation in case of the redundancy test. As repair data to be used in the trimming process (step 8303) shown in the flow chart in FIG. 4, information of fuse cells to be cut is obtained by arithmetic operation from a test result for each chip and collected for each wafer. The repair data are transmitted to the host computer 100 connected via a communication line 201 to be recorded in the magnetic recording unit 120 of the host computer 100 with a file name for identifying the processed lot 700.

Typically, transmission of the repair data is carried out at the time when the wafer end signal (see step 8108 in FIG. 5) is supplied from the measuring prober 400, taking into account the communication efficiency.

Description will be returned to the processing at the measuring prober 400. Judgment is made about whether or not the test has been completed for all of the wafers 1501 through 1525 received in the wafer carrier 1500 (see step 8109 in FIG. 5). If not yet completed for all wafers, the operation returns to wafer loading (step 8102 in FIG. 5). If completed for all wafers, the test comes to an end (step 8110).

The test program and the repair data transfer of the IC tester 300 are controlled by a CPU 310 of the IC tester 300. The measuring prober 400 is controlled by the CPU 410 of the measuring prober 400. Such controlling operations are executed by specific control software applications operating on the respective devices.

Traditionally, the MAP data 121 obtained in the redundancy test are not used in the defect marking process (step 8305 in FIG. 4).

After completion of the redundancy wafer test (step 8302 in FIG. 4), the processed lot 700 is subjected to the trimming process (step 8303) in which substitution of the redundancy cells is carried out for the defective cells. The substitution is also called the replacement as described above.

After completion of the trimming process, the processed lot 700 is subjected to the final wafer test (step 8304 in FIG. 4). In the manner similar to the redundancy (or the initial) wafer test (step 8302 in FIG. 4), the final wafer test is carried out by the structure composed of the IC tester 300 and the measuring prober 400. The final wafer test (step 8304) is different from the redundancy wafer test (step 8302) in that the IC tester 300 is loaded with a test program for the final wafer test which excludes the transmission of the repair data and "BIN/predicted good by trimming" are omitted. The flow chart in FIG. 5 is identical.

At the time when the final wafer test is completed, MAP data 122 of the final wafer test ("FINAL" in FIG. 2) are recorded in the magnetic recording unit 120 of the host computer 100.

Traditionally, the final wafer test is performed for all of the wafers 1501 through 1525 received in the wafer carrier 1500 of the processed lot 700. Therefore, processing of the twenty-five wafers inevitably takes a processing time approximately twenty-five times that for a single wafer.

After completion of the final wafer test (step 8304 in FIG. 4), the processed lot (700 in FIG. 2) is subjected to the defect marking process (step 8305 in FIG. 4). By the use of the MAP data 122 obtained in the final wafer test, defective chips are marked defective by the use of ink.

Specifically, by operation on a marking prober 500, the MAP data 122 recorded in the magnetic recording unit 120 of the host computer 100 is loaded through a communication line 203. The marking prober 500 performs marking operation for the defective chips on the wafers 1501 through 1525 under control of a CPU 510.

Herein, it is not assured that the MAP data 122 of one lot are loaded in the marking prober 500. Depending on the capacity of the marking prober 500, more than the MAP data of one wafer, i.e., more than a part of the MAP data 122 may not be temporarily stored. In this case, the marking operation is carried out with the MAP data for every single wafer successively transmitted between control software applications of the host computer 100 and the marking prober 500.

After completion of the defect marking process (step 8305 in FIG. 4), the processed lot 700 is delivered to the subsequent step.

As described above, in the above-described prior art, all of the wafers are tested both in the redundancy (the initial) wafer test and the final wafer test. It is impossible to complete a wafer test for all of the wafers in a short time. Process time inevitably increases in proportion to the number of the wafers in the above-described prior art. This requires facility investment corresponding to the number of the wafers to be produced. For example, consideration will be made about a production line for manufacturing 30,000 wafers per month.

It is assumed here that memories of an exactly same kind are manufactured and that the final wafer test requires a measurement time of six hours for 25 wafers/lot. In this event, the number of the measuring probers required is equal to 10 for 30 days.

Typically, one IC tester is required for two measuring probers (400 in FIG. 2). Therefore, five IC testers are required in the above-mentioned assumption. A set of the IC tester and the measuring probers is very expensive.

If a sampling test of only three wafers is realized in every final wafer test according to this invention, the number of measuring probers required for the final wafer test is equal to 1.2 and only one IC tester is sufficient. Thus, the facility investment can be reduced by 80%.

In case where all wafers are tested according to the above-described prior art, TAT (Turn Around Time) before delivery of the products is lengthened.

In case where the sampling test of only three wafers is realized in every final wafer test according to this invention, the final wafer test for one lot is completed for about 40 minutes to proceed to the subsequent step.

This invention will hereunder be described in detail.

A method according to this invention is for carrying out a wafer test for semiconductor wafers, equal in number to N (N being an integer greater than one). Each of the semiconductor wafers has a plurality of chips. Each chip has a memory unit.

The method includes an initial wafer test step for carrying out an initial wafer test for all of the semiconductor wafers to judge whether each chip of each of the semiconductor wafers is a good chip or a defective chip and whether or not each chip of each of the semiconductor wafers is a predictive good chip which is predicted as the good chip if subjected to trimming. The initial wafer test step thereby produces an initial wafer test result representing that each chip of each of the semiconductor wafers is any one of the good chip, the defective chip, and the predictive good chip.

A trimming step is for subjecting each of the predictive good chips to the trimming in response to the initial wafer test result to repair the predictive good chips into the good chips.

A final wafer test step is for carrying out a final wafer test for a reduced number M (M being a positive integer less than N) of sampled wafers sampled among the semiconductor wafers to judge whether each chip of each of the sampled wafers is the good chip or the defective chip. The final wafer test step thereby produces a final wafer test result representing that each chip of each of the sampled wafers is any one of the good chip and the defective chip.

An initial wafer test result modifying step is for modifying the initial wafer test result for the semiconductor wafers except the sampled wafers to produce a modified wafer test result for the semiconductor wafers except the sampled wafers so that each chip represented as the predictive good chip by the initial wafer test result is also represented as the good chip by the modified wafer test result.

An entire wafer test result producing step is for producing an entire wafer test result for all of the semiconductor wafers by adding the modified wafer test result to the final wafer test result.

Preferably, the initial wafer test result modifying step furthermore modifies the initial wafer test result for the sampled wafers to produce an additional modified wafer test result for the sampled wafers so that each chip represented as the predictive good chip by the initial wafer test result is also represented as the good chip by the additional modified wafer test result.

In this case, a comparing step compares the final wafer test result with the additional modified wafer test result to produce a coincidence signal when the final wafer test result is substantially coincident with the additional modified wafer test result.

More specifically, the comparing step produces the coincidence signal when the number of the chips represented as the good chips by the final wafer test result is substantially coincident with the number of the chips represented as the good chips by the additional modified wafer test result.

The entire wafer test result producing step produces the entire wafer test result for all of the semiconductor wafers only when the entire wafer test result producing step receives the coincidence signal.

A marking step marks, in response to the entire wafer test result, each chip represented as the defective chip by the entire wafer test result.

When each chip has, as the memory unit, memory cells and redundancy cells which are substitutable for defective cells of the memory cells by the trimming, the initial wafer test step judges that each chip is the predictive good chip when substitution of the redundancy cells of each chip is possible for all of the defective cells of each chip.

The initial wafer test step judges that each chip is the defective chip when substitution of the redundancy cells of each chip is impossible for all of the defective cells of each chip.

Such substitution is also called the replacement in the art as described above.

The initial wafer test step judges that each chip is the good chip when no defective cell is present in each chip.

Figure 7:
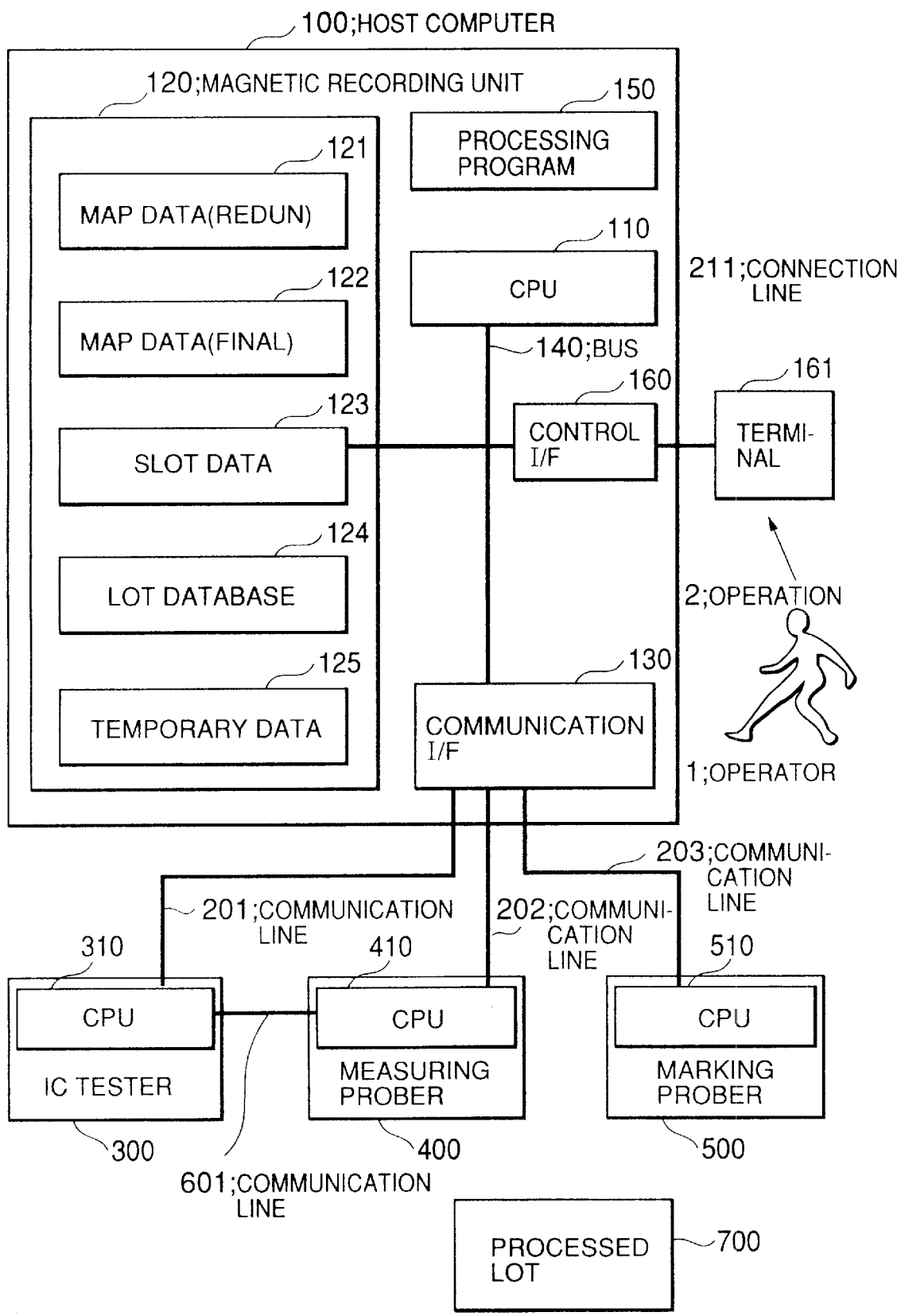
FIG. 7 is a view showing the structure of one embodiment of this invention.

FIG. 7 shows a hardware structure according to the embodiment of this invention. Referring to FIG. 7, in one embodiment of this invention, the host computer 100 comprises a communication interface (I/F) 130 connected to the IC tester 300, the measuring (or testing) prober 400, and the marking (or inking) prober 500 via the communication lines 201, 202, and 203, respectively, for controlling these devices and a control interface (I/F) 160 connected to a terminal 161 to be operated by the operator 1. These interfaces are connected to a CPU 110 via a bus 140. A magnetic recording unit 120 is also connected to the CPU 110 via the bus 140. On the above-mentioned hardware structure, a processing program 150 is executed by the CPU 110 to carry out various controlling operations.

The magnetic recording unit 120 records MAP data (Redun) 121 delivered from the measuring prober 400 in the redundancy wafer test (step 8302 in FIG. 4), MAP data (FINAL) 122 delivered from the measuring prober 400 in the final wafer test (step 8304 in FIG. 4), SLOT data 123 representative of presence or absence of the wafer in each of the slots 1501 through 1525 (FIG. 3B) of the wafer carrier 1500 as the processed lot 700, and a LOT database 124 representative of the relationship between the MAP data (Redun) 121 and the MAP data (Final) 122, i.e., for linking these files for each processed lot 700. Temporary data 125 are a file to be used upon synthesizing the MAP data as will later be described.

Figure 8:
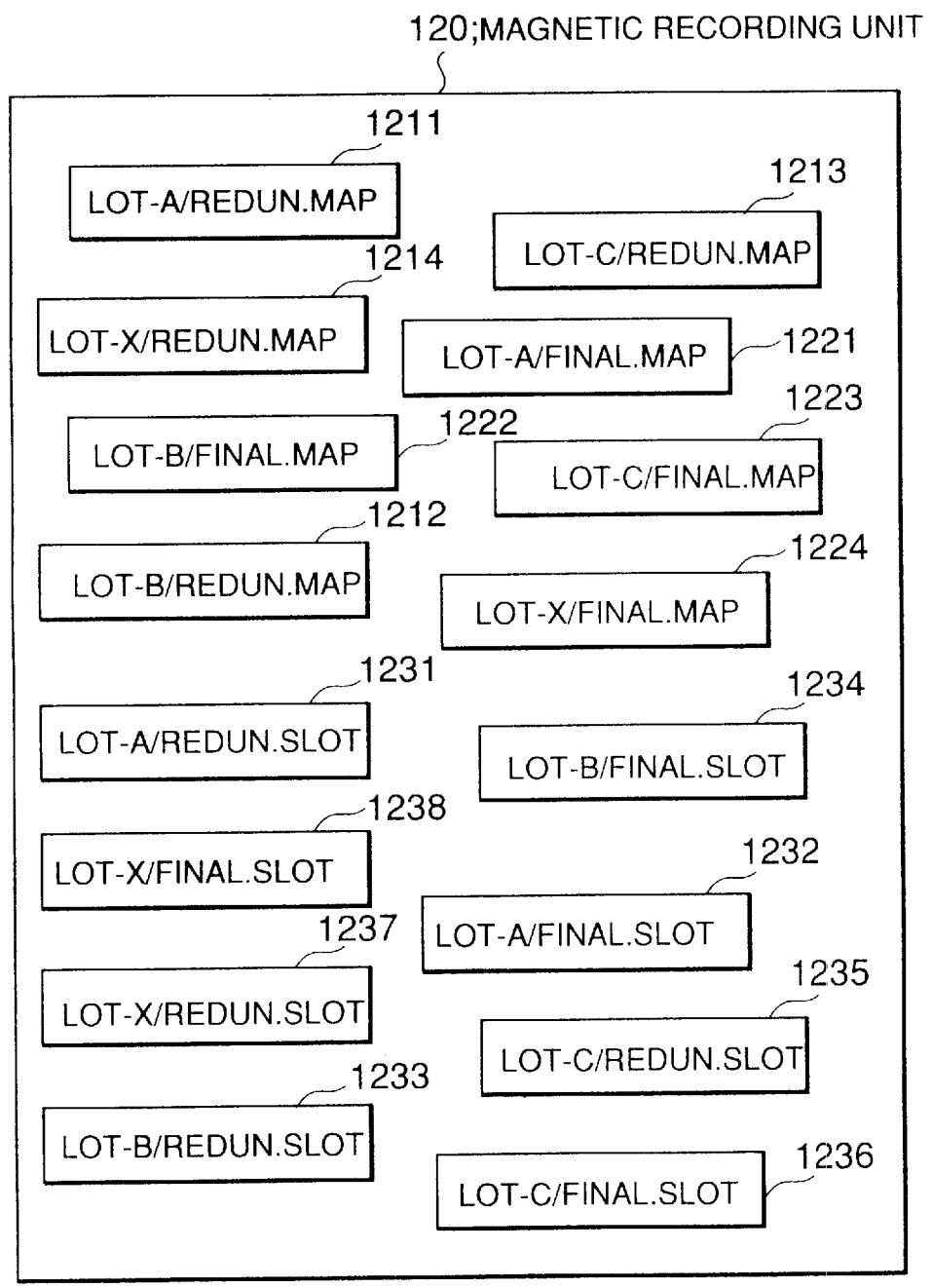
FIG. 8 is view showing a store image of MAP data for describing the one embodiment of this invention.

FIG. 8 shows a store image of the MAP data and schematically represents the MAP data (Redun) 121 and the MAP data (FINAL) 122 stored in the magnetic recording unit 120 in FIG. 7.

As also described in conjunction with the prior art, MAP data 1211 through 1214 and MAP data 1221 through 1224 obtained in the redundancy wafer test (step 8302 in FIG. 4) and the final wafer test (step 8304 in FIG. 4), respectively, for one processed lot 700 are recorded in the magnetic recording unit 120 for each processed lot and for each process. For example, the lot is discriminated by a directory while the process is identified by its name. The data 1211 labelled LOT-A/REDUN.MAP represents the MAP data for the processed lot LOT-A in the redundancy test while the data 1221 labelled LOT-A/FINAL.MAP represents the MAP data for the processed lot LOT-A in the final wafer test.

In addition, SLOT data 1231 through 1238 representative of presence or absence of the wafers in the wafer carrier 1500 (FIG. 3A) are recorded in the magnetic recording unit 120 for each processed lot and for each process. The data 1231 labelled LOT-A/REDUN.SLOT represents the SLOT data for the processed lot LOT-A in the redundancy test while the data 1232 labelled LOT-A/ FINAL.SLOT represents the SLOT data for the processed lot LOT-A in the final wafer test.

Figures 9A, 9B:
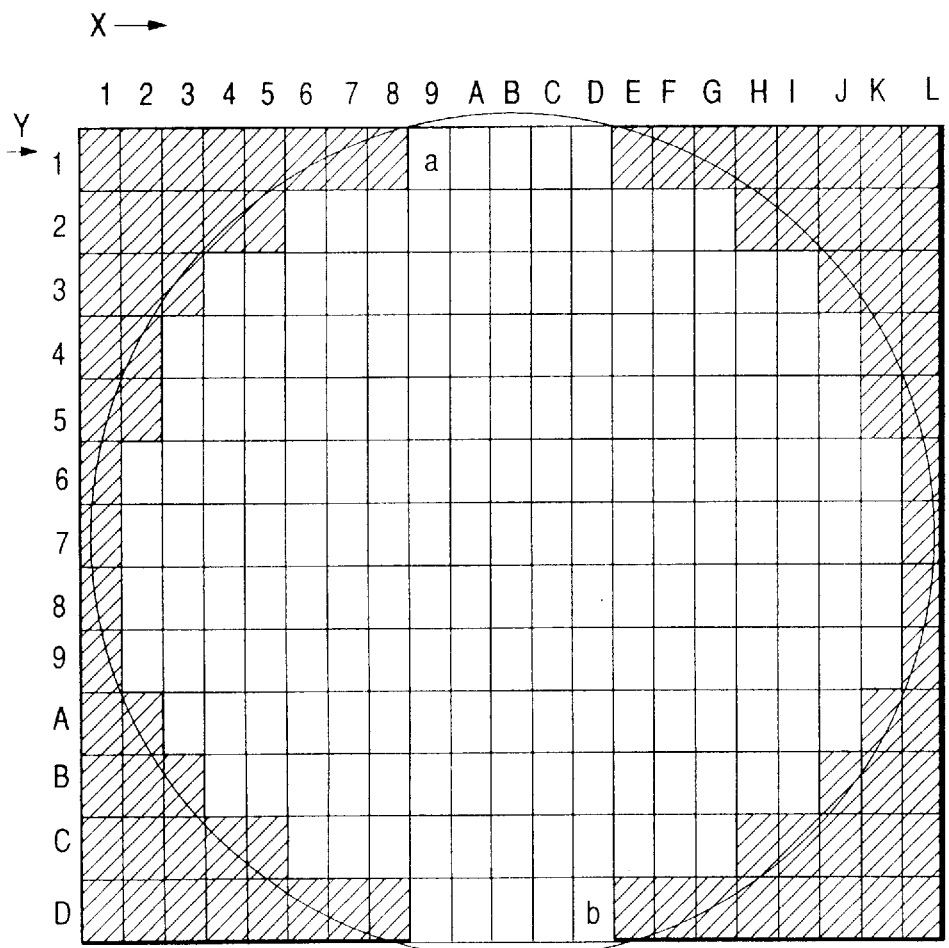
FIGS. 9A and 9B are views showing a relationship between the MAP data and chips on a wafer for describing FIG. 6.

FIG. 6 shows a MAP data structure recorded in the magnetic recording unit 120. Header information is recorded at the top and followed by measurement results of the respective slots in the wafer carrier 1500. FIG. 9A shows the detail.

The header information includes various kinds of information to identify the product, for example, the name of the product (NAME MEMORY in the figure), a lot number (LOT#LOT-A in the figure), and the indication of the process (PROCESS FINAL in the figure).

Although not illustrated in the figure, the header information typically includes, in addition to the product name, the lot number, and the process indication described above, an ID of a facility used, the name and the version of a measurement program used, the name of the operator, the process time, an angle of an orientation flat or a notch, an ID of a probe card used, and an ID of a test board used.

Next, description will be made about the measurement result for each slot. In order to facilitate an understanding, the measurement result is herein given in the format illustrated in FIG. 9A.

At first shown is the slot number (Wafer#1 represents the first slot (1601)) followed by a symbol "_" for separating data including the measurement results of the respective chips. More specifically, referring to FIG. 9A, the chip labelled #9,1 (the chip at a ninth column and a first row in X and Y axes, respectively) has the measurement result FAIL and the BIN measurement (16 bits) as BIN1=1 (set), BIN2=0 (not set), . . . , and BIN16=0 (not set) in the order from the left.

Next recorded is the measurement result of the chip labelled #A,1 (the chip at an A-th column and a first row in the X and the Y axes, respectively). Finally, the measurement result of the chip labelled #D,D (the chip at a D-th column and a D-th row in the X and the Y axes, respectively) is recorded with an identifier "!!" representative of the last chip. Thus, the measurement result of a single wafer is completed.

Subsequently, for the second through the twenty-fifth slots 1602 through 1625, the measurement results for those slots are recorded as far as the wafers are present therein upon measurement.

FIG. 9B shows chip positions on the wafer by the use of a circle and rectangles to facilitate understanding. Referring to FIG. 9B, the chip a is at the ninth column and the first row in the X and the Y axes, respectively, while the chip b is at the D-th column and the D-th row in the X and the Y axes, respectively.

In FIG. 9A, "c" represents the measurement results of all chips on the wafer in the first slot while "d" represents the measurement results of all chips of the wafer in the thirteenth slot.

FIG. 10 shows a SLOT data structure recorded in the magnetic recording unit 120. The header information is recorded at the top and followed by the information representative of presence or absence of the wafer in each slot of the wafer carrier 1500. FIG. 11 shows details of the header information.

In FIG. 11, like the MAP data, the header information includes various kinds of information to identify the product, such as the name of the product (NAME MEMORY), the lot number (LOT#LOT-A), and the indication of the process (PROCESS FINAL).

In order to facilitate an understanding, the information indicative of presence or absence of the wafer in each slot is given in the format illustrated in the figure. At first shown is the slot number (Wafer#1 represents the first slot 1601) followed by the symbol "_" for separating the data. Thereafter, "1" and "0" are recorded if the wafer is present and absent, respectively. This identification number may not only represent presence or absence of the wafer but may serve another purpose such as indication of a lot-out wafer as "2".

The MAP data and the SLOT data have the following relationship.

1. In the MAP data, the information of the wafers which have been measured is entirely recorded.

2. Corresponding to the MAP data in the same lot and the same process, the SLOT data of the wafer which have been measured are recorded as "wafer present", i.e., Wafer#n_1, immediately after completion of the process in consideration. It is assumed here that the wafer is no longer present in the slot because the wafer is broken before it is subjected to the subsequent process. In this event, the operator 1 executes the operation 2 on the terminal 161 of the host computer 100 to rewrite the SLOT data into "wafer absent", i.e., Wafer#_0.

Figure 12:
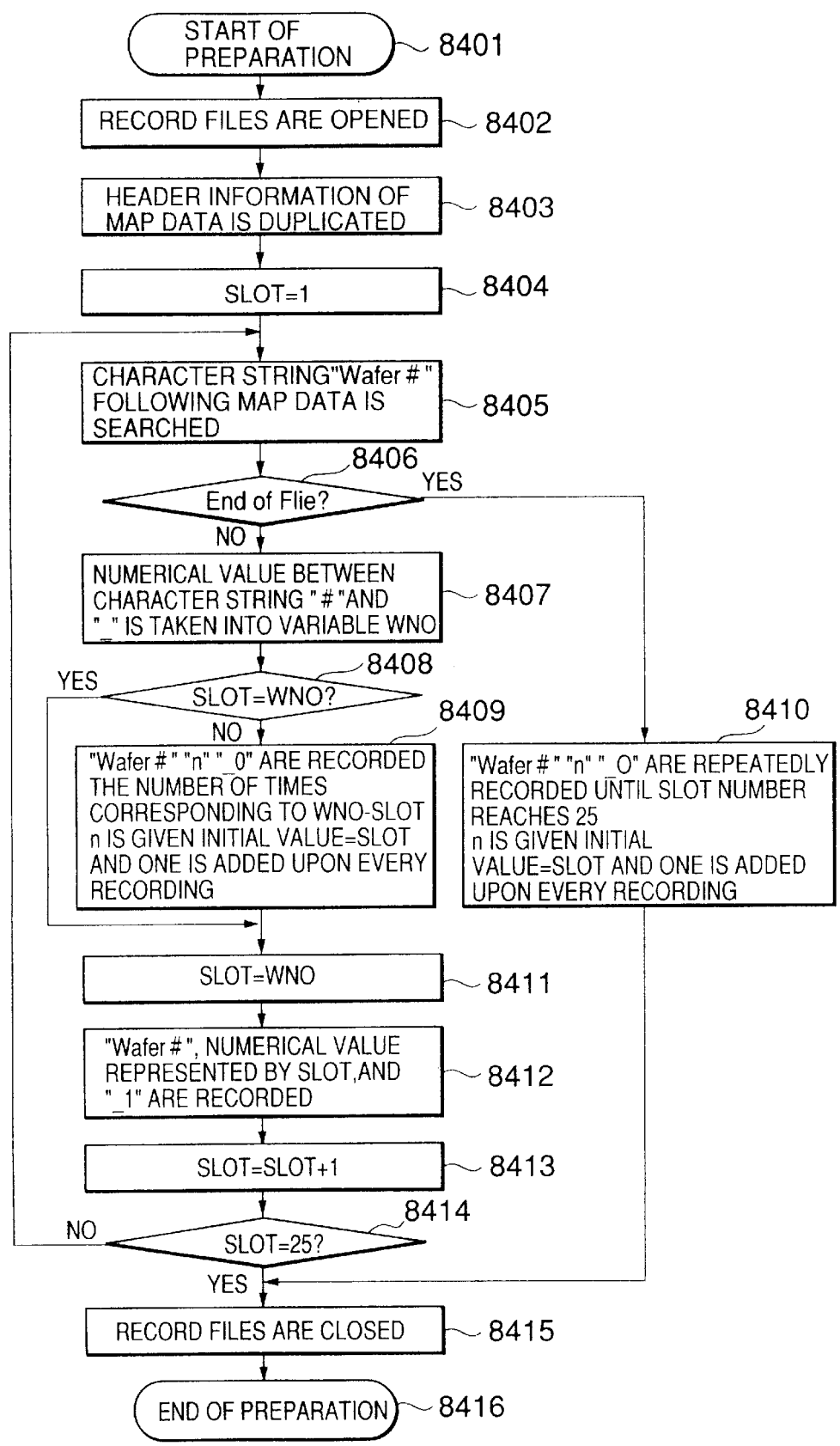
FIG. 12 is a view showing a flow chart of preparation of the SLOT data in the one embodiment of this invention.

FIG. 12 is a flow chart showing preparation of the SLOT data in one embodiment of this invention. The preparation of the SLOT data is carried out immediately after completion of the above-mentioned measuring process, not by the operation 2 of the operator 1 on the terminal 161 of the host computer 100.

After END OF TEST (step 8110 in FIG. 5) in the test flow, the preparation of the SLOT data is started (step 8401 in FIG. 12).

At first, a file is opened to record the SLOT data (step 8402 in FIG. 12). For example, if the lot number is "LOT-A" and the test is the redundancy wafer test, "LOT-A/REDUN SLOT" 1231 in FIG. 8 is prepared as the file. There are two occasions where no file is present yet because this is a first measurement and where the file is already present because this is a second or subsequent measurement. If the file is already present, the file is overwritten by a new content.

Subsequently, the header information of the MAP data (1211 in FIG. 8) is read and duplicated in the SLOT data 1231 (step 8403 in FIG. 12).

An initial value of the slot number is set in a variable SLOT (step 8404 in FIG. 12).

A character string representative of the slot number is searched (step 8405 in FIG. 12). If the end of the file of the MAP data 1211 is reached (yes in step 8406 in FIG. 12), "Wafer#n_0" (n being the slot number) representative of "wafer absent" is repeatedly recorded until the slot number reaches 25 (step 8410 in FIG. 12). The file of the SLOT data 1231 is closed (step 8413 in FIG. 12) and the operation comes to an end (step 8414 in FIG. 12).

If the character string representative of the slot number is found, the numeral interposed between the "#" and "_" in the character string is picked up and set in a variable "WNO" (step 8407 in FIG. 12) which is compared with the value of the variable SLOT (step 8408 in FIG. 12). Upon incoincidence (no in step 8408 in FIG. 12), "Wafer#n_0" (n being the slot number) representative of the "wafer absent" is recorded the number of times corresponding to the difference between the slot number picked up as described above and the value set in the variable SLOT (step 8409 in FIG. 12).

Referring to FIG. 12, subsequently or when the comparison between the variable "WNO" and the variable SLOT in the step 8408 results in coincidence (yes in step 8408), the value of the variable SLOT is set in the variable "WNO" (step 8411) and "Wafer#n_1" (n being the slot number represented by the variable SLOT) representative of "wafer present" is recorded (step 8412). Then, one is added to the value of the variable SLOT (step 8413). Herein, if the value of the variable SLOT is greater than 25 (yes in step 8414), the SLOT data file 1231 is closed (step 8415) and the operation comes to an end.

On the other hand, if the value of the variable SLOT is not greater than "25" (no in step 8414), the operation returns to the step 8405 in which the character string representative of the slot number is searched. Until the value of the variable SLOT exceeds "25", the steps 8406 through 8413 are repeated. Upon detection of the end of file, the operation jumps to the step 8410.

Figure 13:
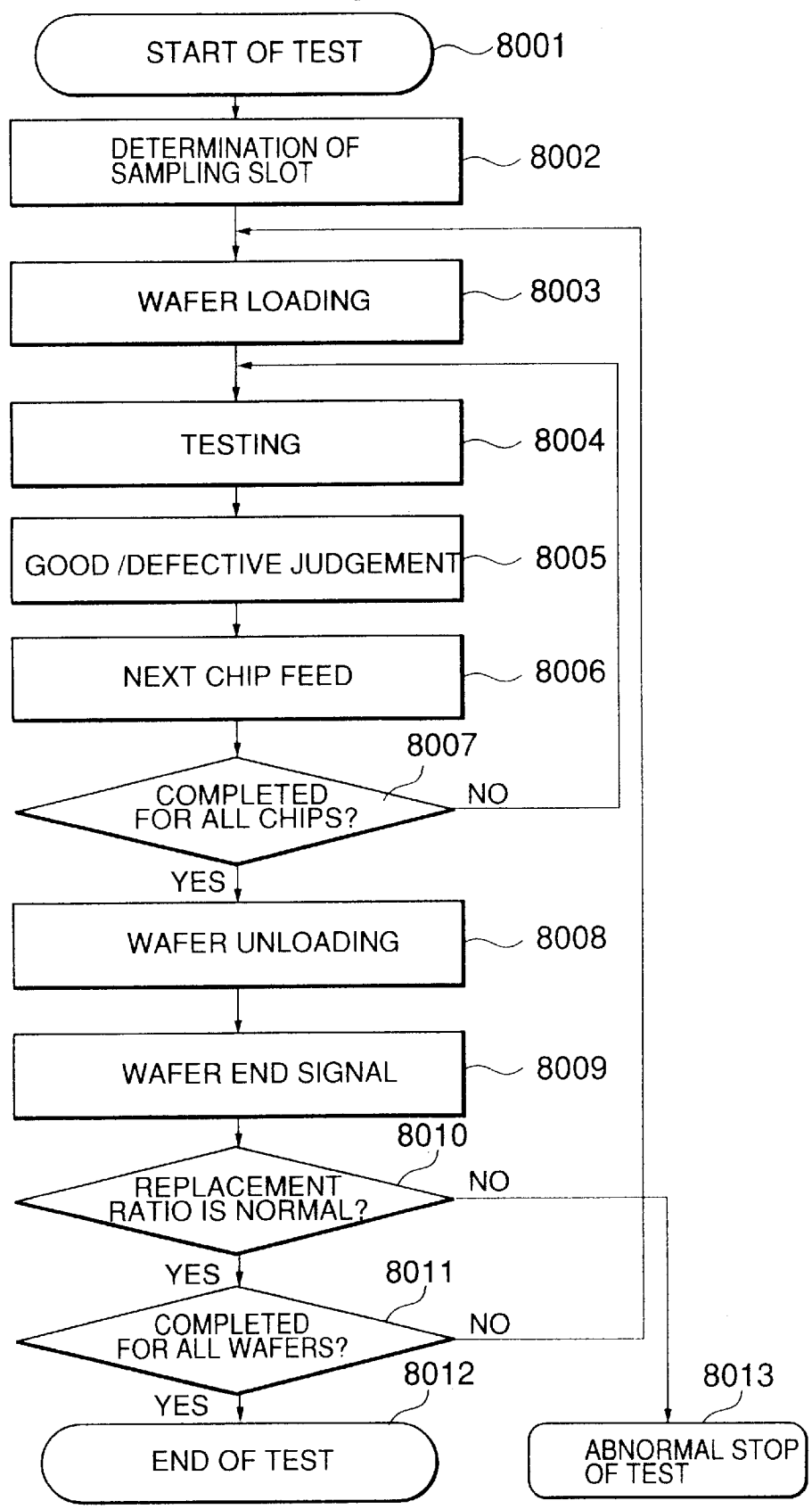
FIG. 13 is a view showing a flow chart of a sampling test in the one embodiment of this invention.

FIG. 13 is a flow chart showing the sampling test according to the one embodiment of this invention. Referring to FIG. 13, START OF TEST 8001, WAFER LOADING 8003, TESTING 8004, GOOD/DEFECTIVE JUDGMENT 8005, NEXT CHIP FEED 8006, COMPLETED FOR ALL CHIPS 8007, WAFER UNLOADING 8008, WAFER END SIGNAL 8009, COMPLETED FOR ALL WAFERS 8011, and END OF TEST 8012 are similar in operation to START OF TEST 8101, WAFER LOADING 8102, TESTING 8103, GOOD/DEFECTIVE JUDGMENT 8104, NEXT CHIP FEED 8105, COMPLETED FOR ALL CHIPS 8106, WAFER UNLOADING 8107, WAFER END SIGNAL 8108, COMPLETED FOR ALL WAFERS 8109, END OF TEST 8110 in FIG. 5, respectively.

After completion of the trimming process (step 8303) in the flow chart of the wafer test process in FIG. 4, the final wafer test (step 8304) of the processed lot 700 is started (step 8001 in FIG. 13). At first, sampling slots are determined (step 8002 in FIG. 13).

Figure 14:
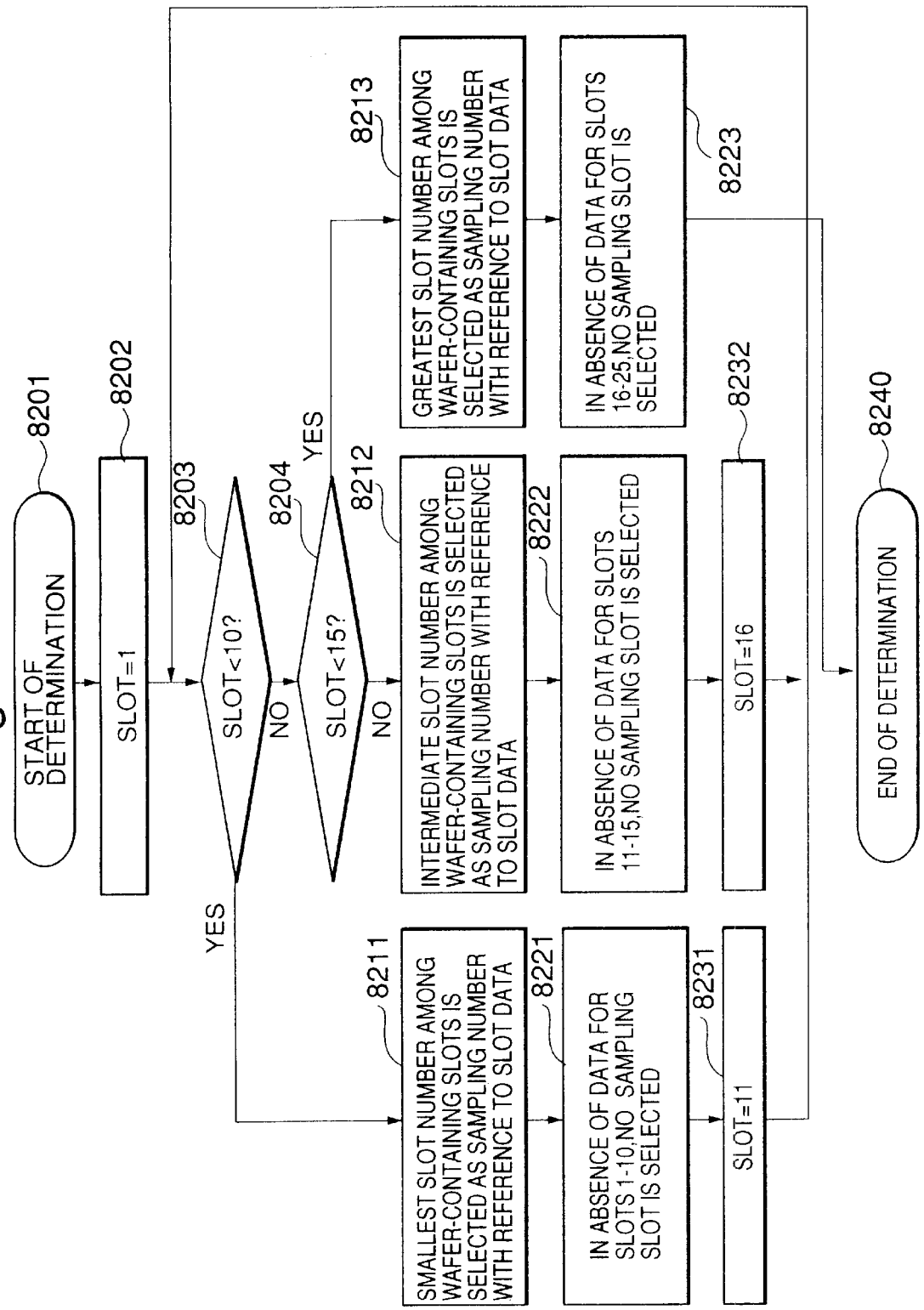
FIG. 14 is a view showing a flow chart of determination of sampling slots in the one embodiment of this invention.

FIG. 14 shows a flow chart of determination of the sampling slots. Description will hereinafter be made as regards the case where three wafers are sampled. In the wafer carrier 1500, the slots 1 through 10, the slots 11 through 15, and the slots 16 through 25 are defined as first, second, and third blocks, respectively. Now, determination of the sampling slots is started (step 8201 in FIG. 14).

Referring to FIG. 14, a start slot variable is at first given "1" (SLOT=1 in step 8202). Since the slot number is smaller than "10" (yes in step 8203), the smallest number of those of the slots 1 through 10 which contain the wafers is detected from the slot data 123 to be determined as the sampling slot (step 8211).

For example, if no wafer is present in the slot 1 and the wafers are present in the slots 2 through 10, the slot 2 is determined as the smallest slot number.

If no wafer is present in any of the slots 1 through 10, the wafer to be sampled is not present (step 8221).

In order to determine a next sampling slot from the slots 11 through 15, the slot variable is given "11" (SLOT=11 in step 8231). Then, the operation returns to immediately before the judgment step 8203.

Since the slot number is greater than "10" (no in step 8203) and smaller than "15" (no in step 8204), the slot number at the center of the slots 11 through 15 is detected from the slot data 123 to be determined as the sampling slot (step 8212). For example, the slot exactly at the center of the slots 11 through 15 is the slot 13. However, if the wafers are present in the slots 11 and 12 and 14 and 15, the slot 12 or the slot 14 is nearest to the center. In this case, the control program can select either slot. If no wafer is present in the slot 13, the slot 14 by +1 is confirmed and, if the wafer is present, determined as the sampling slot. Alternatively, the slot 12 by −1 may be similarly confirmed and determined.

Briefly speaking, the slots containing the wafers are confirmed in the order of 13→14→12→15→11 or 13→12→14→11→15.

If no wafer is present in each of the slots 11 through 15, no sampling wafer is selected (step 8222).

In order to determine another sampling slot from the slots 16 through 25, the slot variable is given "16" (SLOT=16 in step 8232) and the operation returns to immediately before the judging step 8203.

Since the slot number is greater than "10" (no in step 8203) and greater than "15" (yes in step 8204), the greatest number among those of the slots 16 through 25 which contain the wafers is detected from the slot data 123 to be determined as the sampling slot (step 8213). For example, no wafer is present in the slot 25 and the wafers are present in the slots 16 through 24, the slot 24 is determined as the greatest slot number.

If no wafer is present in each of the slots 16 through 25, no sampling wafer is selected (step 8223).

In the above-mentioned manner, the determination of the three sampling slot numbers is completed (step 8241). In the following description, the sampling slot numbers are assumed to be "1", "13", and "25". The information of presence or absence of the wafers in the wafer carrier 1500 as the processed lot 700 is obtained in FIG. 14 with reference to the SLOT data 123. However, some of recent wafer probers have a function of confirming presence or absence of the wafers in the wafer carrier 1500 after loading the wafer carrier. Therefore, the SLOT data 123 may be replaced by the above-mentioned function.

The final wafer test by sampling (8304 in FIG. 4) is carried out in the following manner. The first sampling wafer 1501 of the wafer carrier 1500 as the processed lot 700 is loaded (step 8003 in FIG. 4) to start a final wafer characteristic test (step 8004 in FIG. 13).

At this time, if a formed chip is defective and completely good, judgment is made as "defective" and "good", respectively. The "good/defective judgment result" and "BIN" are transmitted from the IC tester 300 to the measuring prober 400 through a communication line 1601 (step 8005).

Then, in the measuring prober 400, the stage is lowered to release the contact between a probe card and the chip and, after moving to a next formed chip, the stage is raised to bring the probe card and the chip into contact (step 8006).

Then, judgment is made about whether or not the test has been completed for all chips formed on the wafer 1501 (step 8007). If not completed for all chips, the operation returns to the step 8004. If completed for all chips, the wafer 1501 is returned to the wafer carrier 1500 (step 8008) and the wafer end signal is transmitted from the measuring prober 400 to the IC tester 300 through the communication line 601 (step 8009).

The measuring prober 400 sends the wafer end signal also to the host computer 100 through the communication line 202 together with the "good/defective judgment result" and the "BIN result" obtained in the above-mentioned test for each formed chip. In the host computer 100, the transmitted results are received by the communication I/F 130 and processed in the CPU 110 to be recorded in the magnetic recording unit 120 as the MAP data 122 of the final wafer test ("Final" in FIG. 7).

Herein, description will be made about the operation at the measuring prober 400. Judgment is made about whether or not the test has been completed for all sampling wafers selected from the wafers 1501 through 1525 received in the wafer carrier 1500 (step 8011). If not completed for all wafers, the operation returns to wafer loading in the step 8003. If completed for all wafers, the test comes to an end.

In the foregoing description, the result about those predicted good by trimming (step 8303 in FIG. 4) as predicted in the redundancy wafer test (step 8302 in FIG. 4) and the result actually obtained in the final wafer test (step 8304 in FIG. 4) are not reflected. As will hereafter be described, calculation of a replacement (or substitution) ratio is required to judge the success of the final wafer test by sampling.

The ratio is calculated as follows. After the host computer 100 receives the wafer end signal in the step 8009 in FIG. 13, the number of good chips on one wafer measured in the final wafer test is divided by the sum of the numbers of the good chips and predicted good chips measured in the redundancy wafer test (step 8301 in FIG. 4) for the same wafer.

If the number of the good chips on the one wafer measured in the final wafer test is coincident with the sum of the numbers of the good chips and the predicted good chips measured in the redundancy wafer test (step 8301 in FIG. 4) for the one wafer in the same slot, the ratio is 100%. If the ratio is not smaller than 99.9%, supply of the wafer to the subsequent problem raises no problem.

If the replacement (or substitution) ratio is not smaller than 99.9%, the host computer 100 informs the measuring prober 400 that the replacement (or substitution) ratio reaches the predetermined value and the operation is continued because the replacement (or substitution) ratio is normal (yes in step 8010). If the ratio is less than 99.9%, the host computer 100 informs the measuring prober 400 that the replacement (or substitution) ratio does not reach the predetermined value and abnormally stops the sampling test (step 8013) because the replacement (or substitution) ratio is abnormal (no in step 8010). It is noted here that the predetermined value of the replacement (or substitution) ratio is determined taking into account the final assembling cost and the average yield in selection.

In case of the abnormal stop, the operator 1 investigates the factor bringing about such abnormal condition and removes the factor to proceed the operation. If the factor can not be removed, the processed lot is judged after measurement of all wafers. Entering into the defect marking process (step 8305 in FIG. 4) although the test has been abnormally stopped can be avoided in the following manner. If the host computer 100 judges that the replacement (or substitution) ratio is abnormal, occurrence of an error is recorded in the MAP information of the slot corresponding to the wafer end signal (step 8009 in FIG. 13). In the marking process which will hereafter be described, the MAP data 122 are opened to confirm presence or absence of the error.

In practical use, the progress for the processed lot 700 is monitored so as to proceed with the following process upon normal completion and to stop the operation at the current process upon abnormal completion.

When the final wafer test (step 8304 in FIG. 4) by sampling has been completed for the processed lot 700, the MAP data (Final) 122 to be used in marking are recorded in the host computer 100 only for the three wafers in the slots 1, 13, and 25 in the above-mentioned example of three-wafer sampling. Lacking information for the other unmeasured slots is prepared from the MAP data (Redun) 121.

Figure 15:
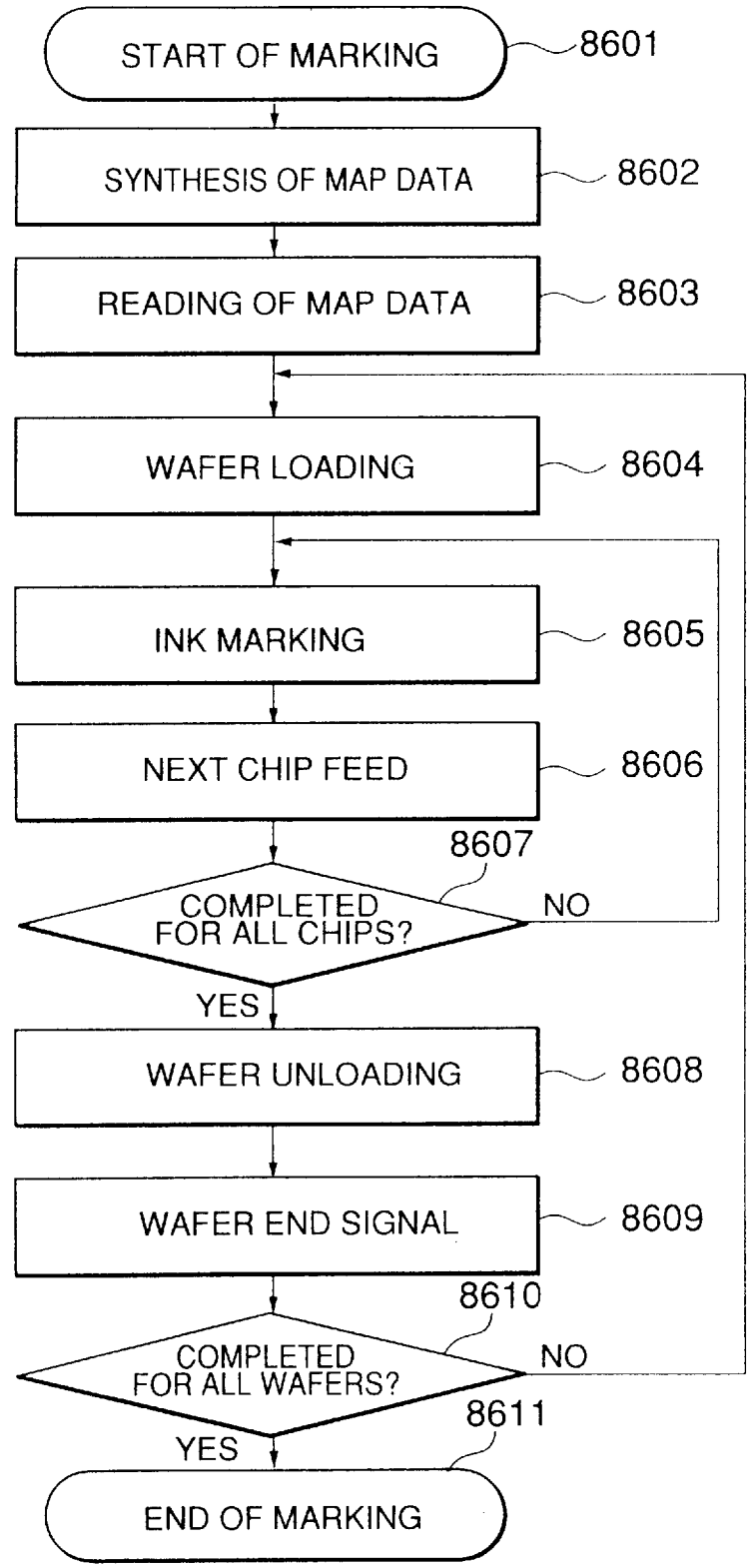
FIG. 15 is a view showing a flow chart of marking in the one embodiment of this invention.

FIG. 15 is a flow chart showing the marking process in the one embodiment of this invention. After completion of the final wafer test (step 8304 in FIG. 4) by sampling in the wafer test process illustrated in FIG. 4, the processed lot 700 is subjected to the defect marking process (step 8305) in which marking is started (step 8601). At first, the MAP data are synthesized (step 8602).

Figure 16:
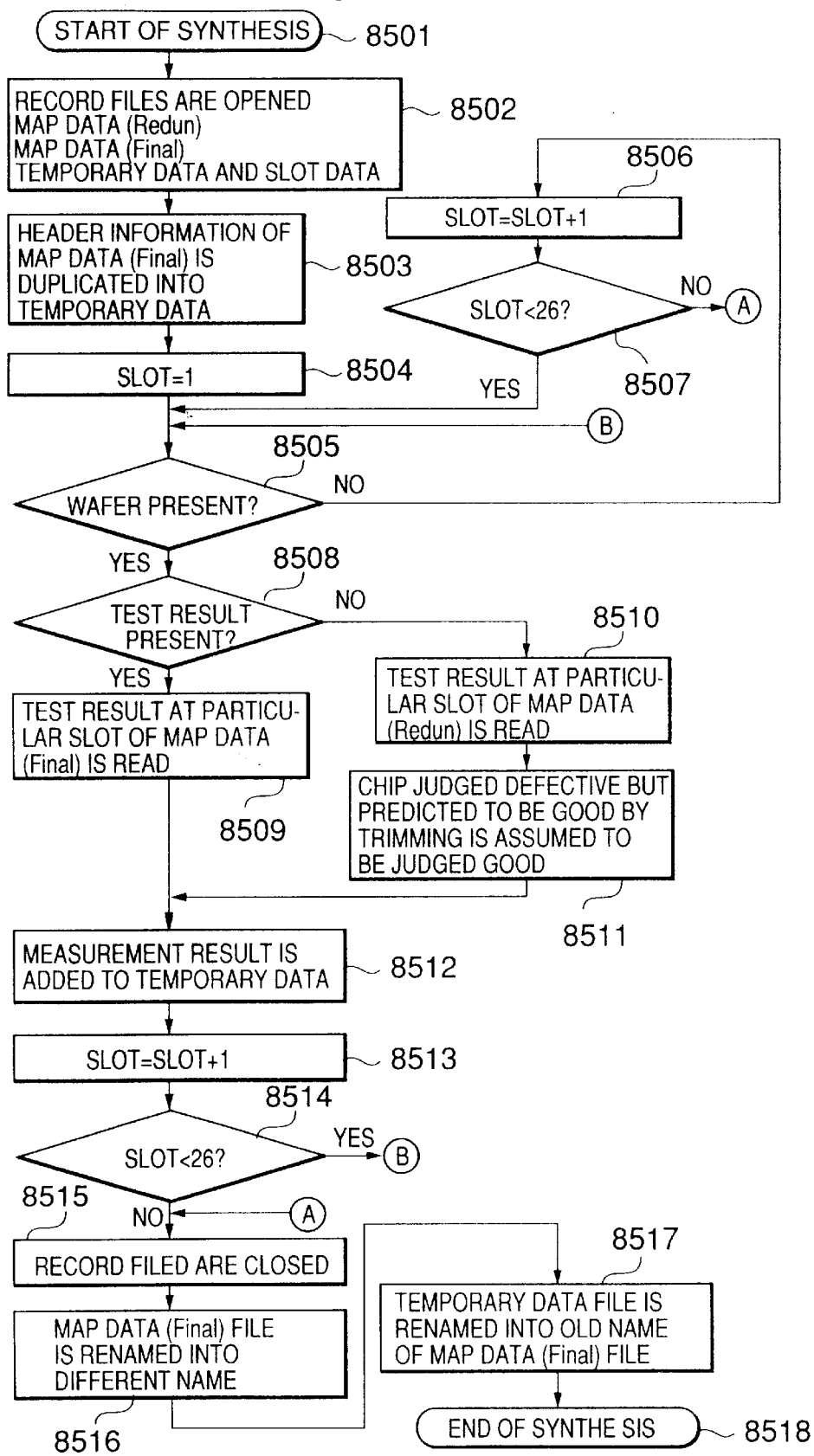
FIG. 16 is a view showing a flow chart of synthesis of the MAP data in the one embodiment of this invention.

FIG. 16 is a flow chart showing the synthesis of the MAP data in the one embodiment of this invention.

Referring to FIG. 16, when the synthesis of the MAP data is started (step 8501), the MAP data (Final) 122 obtained in the final wafer test (step 8304 in FIG. 4) by sampling, the MAP data (Redun) 121 obtained in the redundancy wafer test (step 8302 in FIG. 4) for the lot in question, the temporary data file 125, and the SLOT data 123 are opened (step 8501), respectively, to enable access to the files. Herein, it is assumed that the temporary data file is prepared as a new file.

Next, the header information of the MAP data (Final) 122 are duplicated into the temporary data file (step 8503). A slot variable indicative of a slot to start the synthesis of the MAP data is given a value 1 (step 8504).

With reference to the SLOT data 123, judgment is made about whether or not the wafer is present in the wafer carrier 1500 as the processed lot 700. If no wafer is present (no in step 8505), one is added to the slot variable without any file access (step 8506). If the slot variable is not less than "26" (no in step 8507), the record files are closed (step 8515). The file of the MAP data (Final) 122 is renamed (step 8516) and the name of the temporary data file is renamed into the old name of the file of the MAP data (Final) 122 which has been renamed as described above (step 8517). The synthesis of the MAP data comes to an end (step 8618).

If the slot variable is less than "26" (yes in step 8507), the operation returns to the step 8505 to judge whether or not the wafer is present.

If the wafer is present (yes in step 8505), judgment is made about whether or not the test result in the final wafer test is present, i.e., the MAP data of the slot in question are present (step 8508). If present (yes in step 8508), read is the test result obtained in the final wafer test (step 8304 in FIG. 4), i.e., the MAP data (Final) 122 of the slot in question (step 8509). On the other hand, if no test result is present (no in step 8508), read is the test result obtained in the redundancy wafer test (8302 in FIG. 4), i.e., the MAP data (Redun) 121 of the slot in question (step 8510). If the record includes the prediction result ("BIN/predicted to be good by trimming") that, although the test result is defective, the trimming process (step 8303 in FIG. 4), (i.e., the substitution or the replacement) will provide a good chip, the judgment of defective on the read data is replaced by the judgment of good (step 8511). Referring to FIG. 5A, the character string "FAIL2 as the result is replaced by "PASS" for each chip. The position of "BIN/predicted to be good by trimming" is preliminarily determined.

The measurement results thus read are added to the temporary data 125 (step 8512). One is added to the slot variable (step 8513). If the slot variable is less than "26" (yes in step 8514), the operation returns to the step 8505 to judge whether or not the wafer is present.

If the slot variable is not less than "26" (no in step 8514), the record files are closed (step 8515). The file of the MAP data (Final) 122 is renamed (step 8516) and the name of the temporary data file is renamed into the old name of the file of the MAP data (Final) 122 which has been renamed as described above (step 8517). The synthesis of the MAP data comes to an end (step 8618).

Now, the description returns to FIG. 15.

The marking prober 500 reads the synthesized MAP data (Final) 122 from the magnetic recording unit 120 of the host computer 100 through the bus 140, the communication I/F 130, and the communication line 203 (step 8603).

The first wafer 1501 in the wafer carrier 1500 as the processed lot 700 is loaded (step 8604). Depending upon the good/defective judgment result for each chip recorded in the MAP data (Final) 122, the "defective" chip is marked with an ink stamp (step 8605).

Then, the marking prober 500 moves to a next chip to be subjected to marking (step 8606). Judgment is made about whether or not the marking has been completed for all defective chips on the wafer 1501 (step 8607). If not completed for all [defective] chips, the operation returns to the ink marking in the step 8005. If completed for all [defective] chips, the wafer 1501 is returned to the wafer carrier 1500 (wafer unloading) (step 8608) and the wafer end signal indicative of the wafer end is sent from the marking prober 500 to the host computer 100 through the communication line 203 (step 8609). The marking prober 500 judges whether or not the marking has been completed for all of the wafers 1501 through 1525 received in the wafer carrier 1500 (step 8610). If not completed for all wafers, the operation returns to the wafer loading in the step 8604. If completed for all wafers, the marking process comes to an end (step 8611).

In the marking process described above, it is not assured that the MAP data (Final) 122 of one lot are loaded in the marking prober 500. Sometimes the prober can temporarily store no more than the MAP data of one wafer, i.e., a part of the MAP data (Final) 122. In this event, the marking process is executed with the MAP data for every single wafer successively transmitted between the control software applications of the host computer 100 and the marking prober 500.

After completion of the defect marking process (step 8305 in FIG. 4), the processed lot 700 is delivered to the subsequent process (step 8306 in FIG. 4).

As described above, according to this invention, it is possible in the wafer test process to reduce the investment for the IC tester and the wafer prober which are expensive and to shorten the period required before the delivery of the products. As a result, reduction in cost of the semiconductor memory is achieved.

This is because, according to this invention, the final wafer test is carried out by sampling a part of the wafers but is capable of providing the test result equivalent to the test of all wafers so that the test process is shortened.

What is claimed is:

1. A method of carrying out a wafer test for semiconductor wafers, equal in number to N (N being an integer greater than one), each of said semiconductor wafers comprising a plurality of chips, each chip comprising a memory unit, said method comprising:

an initial wafer test step of carrying out an initial wafer test for all of said semiconductor wafers to judge whether each chip of each of said semiconductor wafers is a good chip or a defective chip and whether or not each chip of each of said semiconductor wafers is a predictive good chip which is predicted as said good chip if subjected to trimming, said initial wafer test step producing an initial wafer test result representing that each chip of each of said semiconductor wafers is any one of said good chip, said defective chip, and said predictive good chip;

a trimming step of subjecting each of said predictive good chips to said trimming in response to said initial wafer test result to repair said predictive good chips into said good chips;

a final wafer test step of carrying out a final wafer test for a reduced number M (M being a positive integer less than N) of sampled wafers sampled among said semiconductor wafers to judge whether each chip of each of said sampled wafers is said good chip or said defective chip, said final wafer test step produce a final wafer test result representing that each chip of each of said sampled wafers is any one of said good chip and said defective chip;

an initial wafer test result modifying step of modifying the initial wafer test result for the semiconductor wafers except said sampled wafers to produce a modified wafer test result for the semiconductor wafers except said sampled wafers so that each chip represented as said predictive good chip by said initial wafer test result is also represented as said good chip by said modified wafer test result; and an entire wafer test result producing step of producing an entire wafer test result for all of said semiconductor wafers by adding said modified wafer test result to said final wafer test result.

2. A method as claimed in claim 1, wherein:

said initial wafer test result modifying step is furthermore for modifying the initial wafer test result for said sampled wafers to produce an additional modified wafer test result for said sampled wafers so that each chip represented as said predictive good chip by said initial wafer test result is also represented as said good chip by said additional modified wafer test result;

said method further comprising a comparing step of comparing said final wafer test result with said additional modified wafer test result to produce a coincidence signal when said final wafer test result is substantially coincident with said additional modified wafer test result;

said entire wafer test result producing step producing said entire wafer test result for all of said semiconductor wafers in response to said coincidence signal.

3. A method as claimed in claim 2, further comprising:

a marking step of marking, in response to said entire wafer test result, each chip represented as said defective chip by said entire wafer test result.

4. A method as claimed in claim 2, wherein said comparing step produces said coincidence signal when the number of the chips represented as said good chips by said final wafer test result is substantially coincident with the number of the chips represented as said good chips by said additional modified wafer test result.

5. A method as claimed in claim 4, further comprising:

a marking step of marking, in response to said entire wafer test result, each chip represented as said defective chip by said entire wafer test result.

6. A method as claimed in claim 1, each chip comprising, as said memory unit, memory cells and redundancy cells which are substitutable for defective cells of said memory cells by said trimming, wherein said initial wafer test step judges that each chip is said predictive good chip when substitution of said redundancy cells of each chip is possible for all of said defective cells of each chip.

7. A method as claimed in claim 6, wherein said initial wafer test step judges that each chip is said good chip when no defective cell is present in each chip.

8. A method as claimed in claim 6, wherein said initial wafer test step judges that each chip is said defective chip when substitution of said redundancy cells of each chip is impossible for all of said defective cells of each chip.

9. A method as claimed in claim 8, wherein said initial wafer test step judges that each chip is said good chip when no defective cell is present in each chip.

\* \* \* \* \*